United States Patent [19]
Cameron

[11] Patent Number: 5,696,460
[45] Date of Patent: *Dec. 9, 1997

[54] DIFFERENTIAL HIGH SPEED INDUCTIVE DRIVER WITH A BIDIRECTIONAL CURRENT LIMITING OUTPUT STAGE

[75] Inventor: Scott Warren Cameron, Milpitas, Calif.

[73] Assignee: SGS-Thomson Microelectronics, Inc., Carrollton, Tex.

[*] Notice: The term of this patent shall not extend beyond the expiration date of Pat. No. 5,546,030.

[21] Appl. No.: 700,765

[22] Filed: Aug. 12, 1996

Related U.S. Application Data

[63] Continuation of Ser. No. 366,793, Dec. 30, 1994, Pat. No. 5,546,030.

[51] Int. Cl.[6] ................................................. H03B 1/00
[52] U.S. Cl. ........................ 327/110; 327/333; 327/563
[58] Field of Search .................................. 327/108, 110, 327/112, 319, 320, 333, 561, 562, 563

[56] References Cited

U.S. PATENT DOCUMENTS 5,333,081  7/1994  Mitsui ............................... 360/46

FOREIGN PATENT DOCUMENTS 0588650  3/1994  European Pat. Off. .
2264386  8/1993  United Kingdom .
84 03013  8/1994  WIPO .

OTHER PUBLICATIONS

IBM Technical Disclosure Bulletin, vol. 14, No. 3, Aug. 1971, NY, pp. 966–967.

Primary Examiner—Timothy P. Callahan
Assistant Examiner—Jeffrey Zweizig
Attorney, Agent, or Firm—David V. Carlson; Theodore E. Galanthay; Lisa K. Jorgenson

[57] ABSTRACT

An innovative circuit for driving the write head. All of the driving transistors are NPN, and are prevented from saturation. This is achieved by shifting and scaling down the differential drive applied to the pull-up transistors, to drive the pull-down transistors with levels such that the pull-down transistors cannot reach saturation. This provides a very simple circuit in which all four of the drive transistors are NPN, and all are kept out of saturation. Moreover, the peak write current applied to the head is precisely limited.

22 Claims, 9 Drawing Sheets

$L \frac{di}{dt} = V$ $i = \frac{1}{L} \int V dt$

THIN FILM HEAD EQUIVALENT CIRCUIT

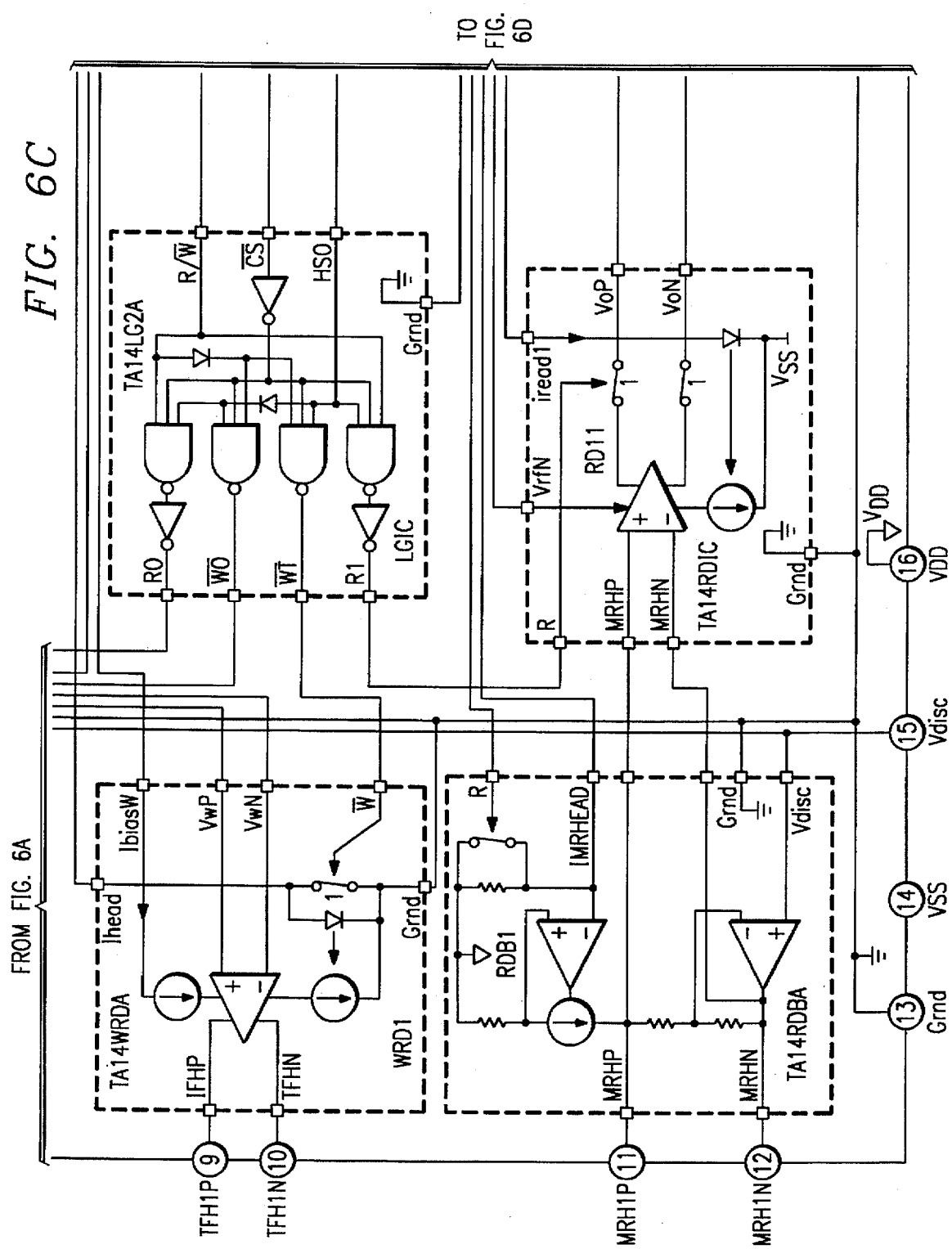

DIFFERENTIAL HIGH SPEED INDUCTIVE DRIVER WITH A BIDIRECTIONAL CURRENT LIMITING OUTPUT STAGE

This is a continuation of U.S. Ser. No. 08/366,793, filed Dec. 30, 1994, now U.S. Pat. No. 5,546,030.

BACKGROUND AND SUMMARY OF THE INVENTION

The present invention relates to circuits and methods for providing bi-directional drive currents to an inductive write head.

Magnetic disk drives have been steadily improved since the 1950s, but most of the basic principles of operation have not changed. A head which includes a solenoidal coil is located in proximity to a rotating platter coated with a ferromagnetic or ferrimagnetic medium. By driving current through the coil, a magnetic field can be generated at the surface of the magnetic medium which is strong enough to induce a transition in the magnetization of the medium. By reversing the current in the coil, the direction of magnetization of the medium can be changed. The domain boundaries thus created can be sensed for reading, and are reasonably stable, and thus provide nonvolatile storage of data. Write amplifiers for magnetic disk drive heads must therefore drive rapid transitions of the current sense across the inductive write head.

In a disk drive, traditionally the head was a coil (or more recently a thin film head which is equivalent to a coil), embedded in some form of a head that slid across the top of the disk planer, and positioned to cream a magnetic field in a small area of the surface of the platter. By controlling the amount of current that flows to the coil, and switching it from one direction to the other direction, a series of magnetic dipoles would be created in the ferrimagnetic medium at the surface of the disk.

Normally a "1" is indicated, on the disk, by a transition in the magnetic field. No transition would imply a zero. (These transitions are synchronized in ways not relevant here.)

A disk drive normally includes multiple head elements each mounted on respective arms. The arms move across the disk and trace out various rings of magnetic data. If we could see the magnetic dothain boundaries in the magnetic medium on the disk, we would see chains of overlapping circles, almost like overlapping punch-outs, where the write head changed its magnetic field and pushed out a new flux domain. The written domains are spaced closely enough to overlap (and therefore very few of them are circular), but there is enough remaining area in each one to preserve the written data.

As manufacturers move to higher disk rotation RPMs and/or smaller physical dimensions to which the write head is magnetically coupled, the bandwidth required for the write head steadily increases. The demands on the write amplifier are fairly severe, and are rapidly becoming more so with improved head and magnetic film technologies. The present invention provides a high speed design, which can obtain very high bandwidth from conventional silicon technology, and provide transitions of about 100 million bits per second with typical head inductances, and potentially up to several hundred MHz for small inductances.

FIG. 1A shows a simplified circuit diagram of the connection of a write amplifier to a thin film disk head. The head appears to the amplifier as a predominantly inductive load of relatively large value (e.g. 600–800 nH).

FIG. 1B shows a more detailed model of the electrical properties of the thin film disk head, including its connections. Typical magnitudes for the reactance components shown are:

$C_{(leads)} \approx 5$ pF;
$L_{(head)} \approx 700$ nH;
$R_{(head)} \approx 40$ Ω;
$L_{(leads)} \approx 100$ nH each.

As of 1995, the read and write data rates are typically in the neighborhood of 180 megabits per second. Since each edge (rising or falling) corresponds to one bit, the frequency is therefore typically in the neighborhood of 50 MHz. Achieving this speed with the significant inductance of the head coil is not easy.

Inductive voltage is often stated as V=LdI/dt; but to properly analyze the rise time effects in an inductive load, the basic inductance relationship should be stated in a way which preserves causality:

$$I = \frac{1}{L} \int V dt.$$

That is, the correct causality (in a write head) is that the voltage is changed, and this produces a change in current. Thus when the inputs to an inductive load are switched, the voltage can be changed quickly, and the current will then ramp up in proportion to the time integral of the applied voltage.

FIG. 2 is a current timing diagram, showing how the head current behaves during two transitions in opposite directions. Once the applied voltage reaches its maximum value, the current changes at a steady rate dI/dt.

FIG. 3 shows an ideal voltage waveform for write drive. Suppose that the coil current has been constant for a relatively long time: the inputs are in one direction, and the voltage across the inductor is just an IR drop. When we switch the inputs, initially the current can't change in the inductor, so the inductor looks like an infinite resistance and the driver will rapidly slew to its full voltage swing $V_{sat}$. This voltage $V_{sat}$ causes a dI/dt in the inductor, and the current will change at a steady rate until the amplifier approaches its current limit (a value which is programmed by the external resistor, in the presently preferred embodiment). Now as the current begins to level off at the new current level, the voltage across the inductor drops, until its connections reach the same IR voltage magnitude which was originally present. (However, this new IR voltage has the opposite sign to that previously present.)

The magnitude of the amplifier's peak voltage $V_{sat}$ will determine the rate at which we can change the coil current. Typical values for $T_{SLEW}$ in 1994 are in the range of 4 to 9 nsec.

The voltage slew rate of the write amplifier is also significant, since this too is a component of delay and limits the data rate. However, the time at $V_{sat}$, during which the current is changing at its peak rate, will normally dominate the switching time.

Thus one important objective is to provide a sufficiently high magnitude of Vsat. A secondary objective is to provide an adequately high voltage slew rate at the amplifier output. A further objective is to provide an accurately regulated peak current. The disclosed circuit embodiments provide innovative circuit ideas which are advantageous in meeting all of these objectives.

Propagation delay in the path into the write amplifier is relatively unimportant, since it does not affect the data rate.

To maximize switching speed in bipolar technology, it is desirable to keep the bipolar transistors from saturating. Moreover, the use of bipolar rather than MOS transistors provides additional headroom, since the diode drop of a bipolar transistor is only about 0.7 volts, as compared to a MOS threshold voltage of typically 1.0 or 1.1 volts. The present invention drives the pull up transistors directly with a differential signal obtained by standard techniques, but uses a shifted and scaled version of the base voltage of the pull up transistors to drive the pull down transistors. Moreover, a current source regulates the current which can be drawn by the pull down transistors.

It is also preferable to use NPN rather than PNP devices in speed-critical paths. Some attempts have been made to use PNP devices in bipolar drivers, but the problem when high frequencies are required is that PNP drivers necessarily exhibit longer switching times, due to the lower mobility of holes. Thus, while the size of PNP drivers can be adjusted to provide a gain which is reasonably balanced with that of NPN drivers, mere sizing adjustments cannot solve the problem of switching time.

In magnetic write applications, it is desirable to carefully control the maximum current provided. However, in other applications, this may not be necessary.

Innovative Write Amplifier

The present application discloses an innovative circuit for driving the write head. In this circuit, all of the driving transistors are NPN, and all are prevented from saturation. This maximizes their switching speed. This is achieved by shifting and scaling down the differential drive applied to the pull-up transistors, to drive the pull-down transistors with levels such that the pull-down transistors cannot reach saturation. This provides a very simple circuit in which all four of the drive transistors are NPN, and all are kept out of saturation. Moreover, the peak write current applied to the head is precisely limited.

Note that the innovative circuit is not a switching circuit, and not an H-bridge, but rather a fully differential double-ended driving circuit. By contrast, an H-bridge has four inputs and they are driven by separate circuits which must be synchronized. By putting the level shifter right at the immediate output stage and decoding a differential signal to drive it, we have bypassed all of that. H-bridge switching circuits are conventionally used for low-speed bidirectional switching; but for high-frequency capabilities such as is required by write amplifiers, such switching circuits are wholly inadequate.

Since the properties of magnetic media will vary between manufacturers, and as processes and materials are optimized, the write amplifier, in the presently preferred embodiment, provides precise mirroring of current drawn on an external pin, to accurately define the current that would flow in the coils. Thus, the drive manufacturer can accurately control the write current by changing the value of an external precision resistor to the ground, or alternatively by connecting a programmable current sink to this pin. Thus the drive manufacture can change the current for different head medium characteristics.

The necessity for reversal of current direction on a differential output appears in other applications also, including drivers for voice coils and other small electromechanical actuators, ultrasonic transducers for imaging at VHF and higher frequencies, and switching or phase-shifting of microwave signals. The disclosed circuit can be advantageous in these and many other analogous applications.

BRIEF DESCRIPTION OF THE DRAWING

The disclosed inventions will be described with reference to the accompanying drawings, which show important sample embodiments of the invention and which are incorporated in the specification hereof by reference, wherein.

FIGS. 6A to 6D are four parts of a single drawing which shows a sample drive head interface which advantageously incorporates a write amplifier according to FIGS. 3 or 4.

DETAILED DESCRIPTION OF THE PREFERRED EMBODIMENTS

Figure 4:
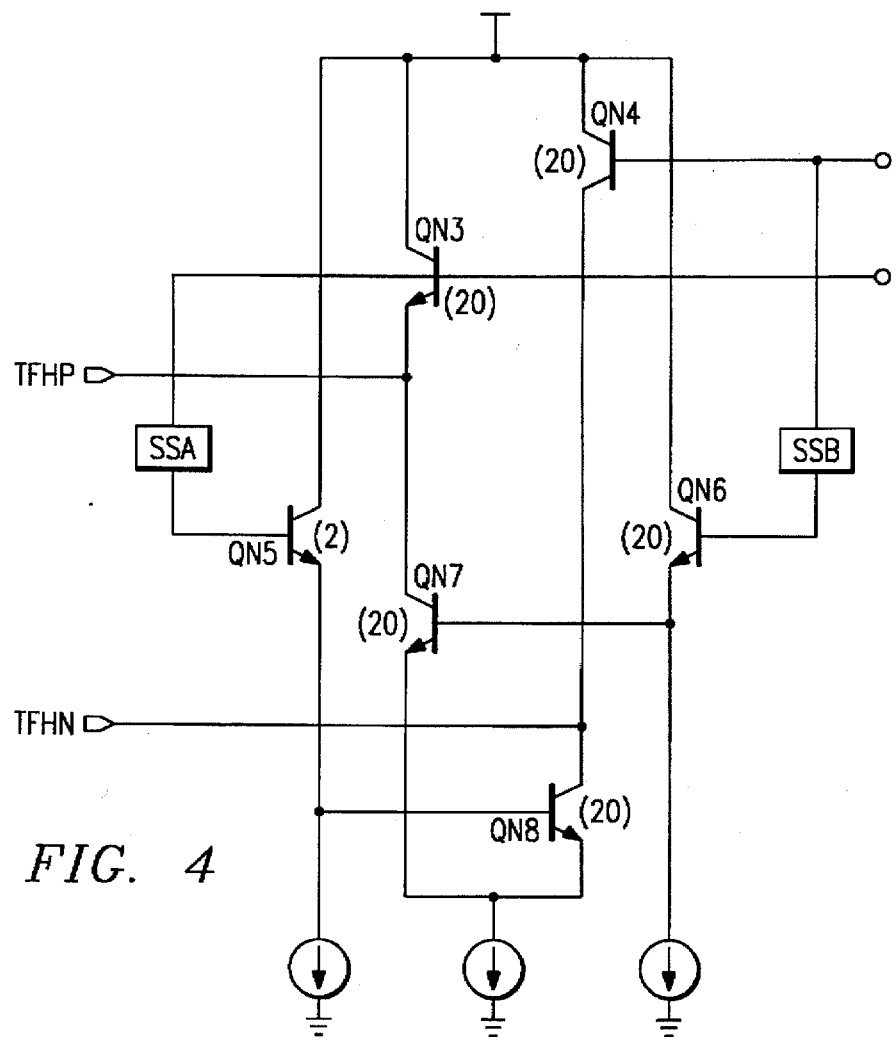
FIG. 4 is a simplified circuit diagram generally showing the write amplifier of the presently preferred embodiment.

The numerous innovative teachings of the present application will be described with particular reference to the presently preferred embodiment (by way of example, and not of limitation), in which:

FIG. 4 is a simplified circuit diagram generally showing the write amplifier of the presently preferred embodiment. In this circuit diagram it may be seen that two shifting+scaling blocks SSA/SSB translate the base drive currents of the two pull-up transistors QN3/QN4 to provide appropriate base drive currents for the two pull-down transistors QN8/QN7. This provides rapid non-saturating operation, as described above.

The goal of this circuit is to switch the inductive load in such a way that during the transient, as well as during the steady stage, none of the NPN transistors are allowed to go into saturation. This avoids any need to charge base capacitances, and the circuit therefore operates relatively quickly.

Figure 5A:
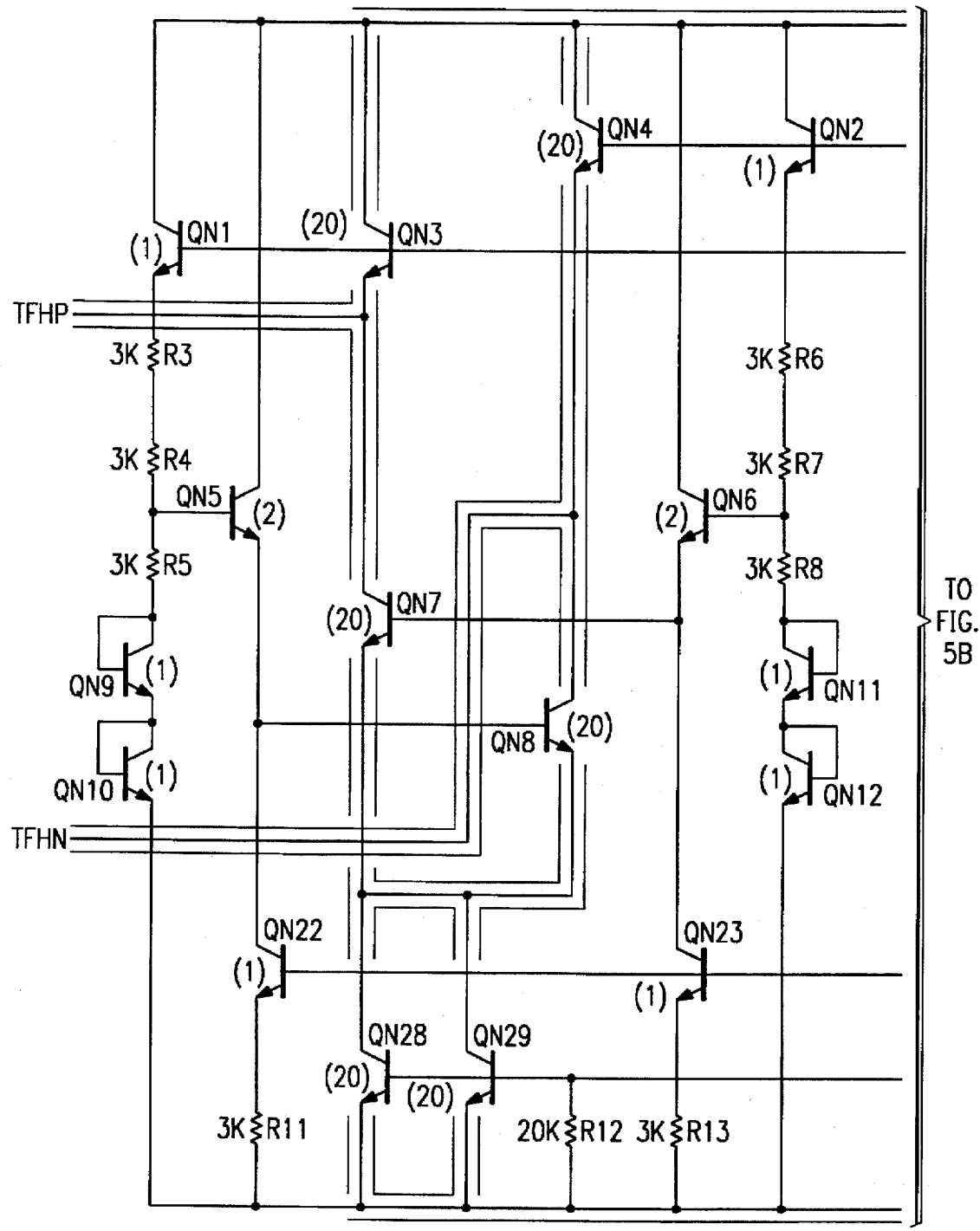
FIGS. 5A, 5B, and 5C are three parts of a single drawing which shows the presently preferred embodiment.
Figure 5B:
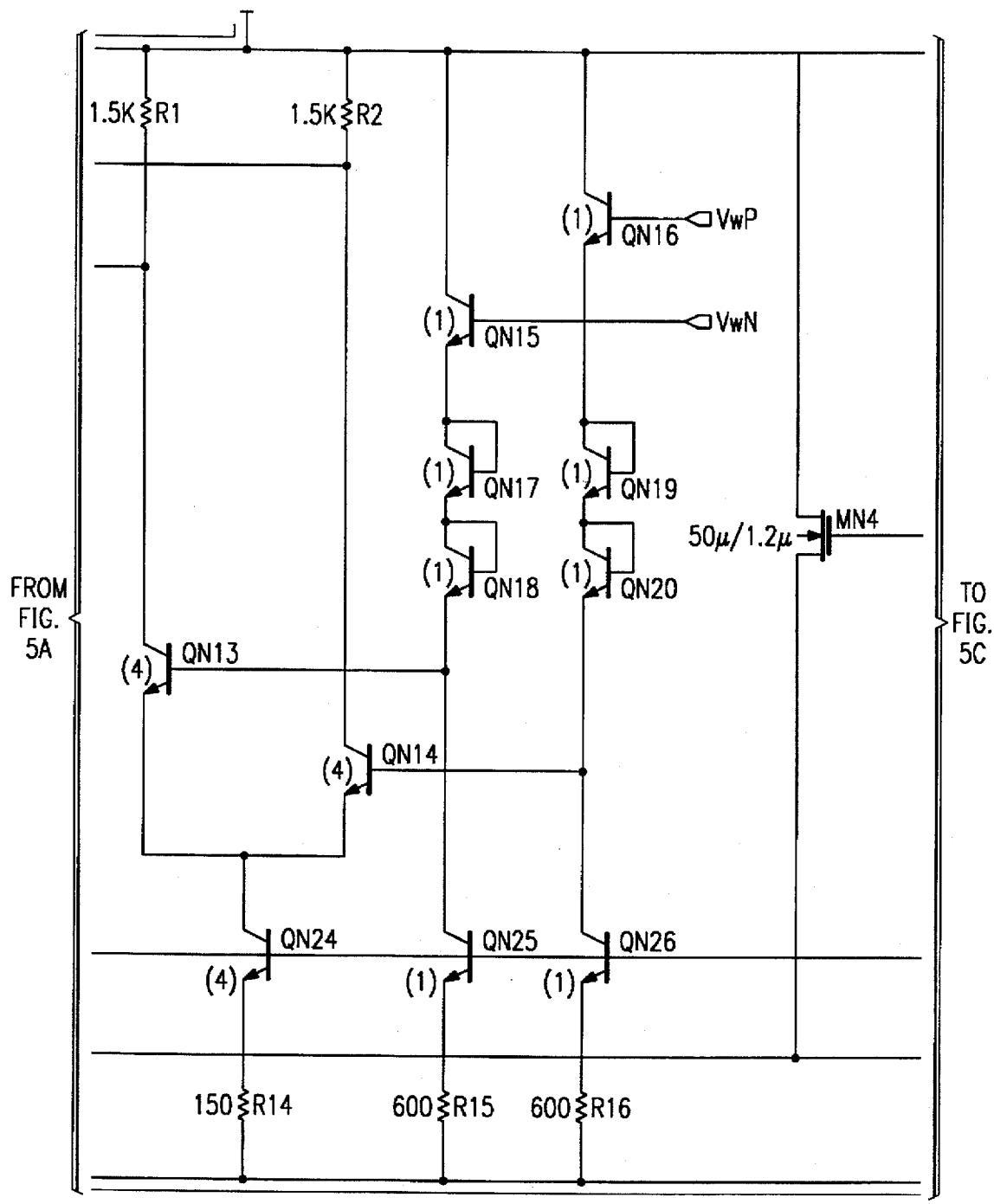
Figure 5C:
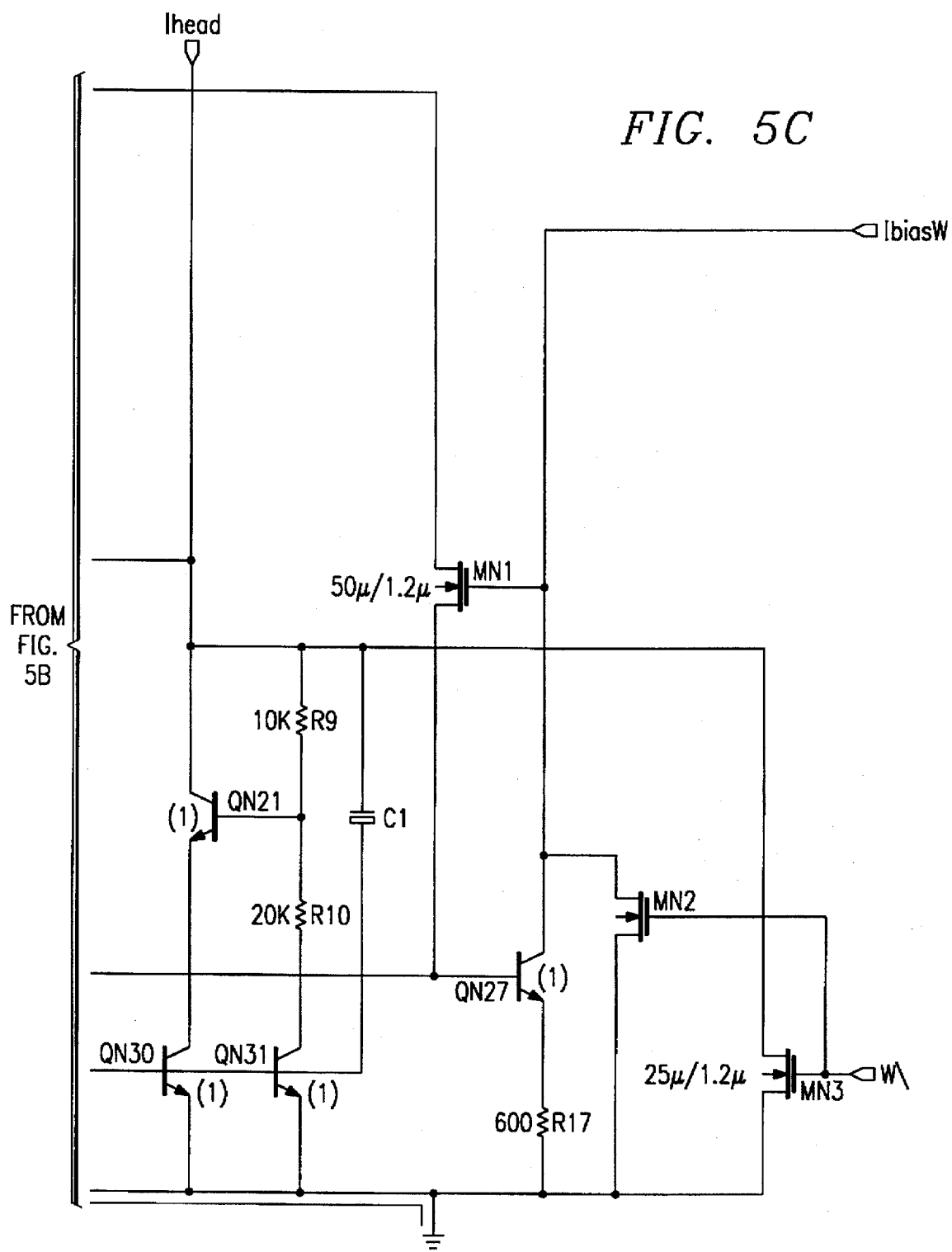
Figure 6A:
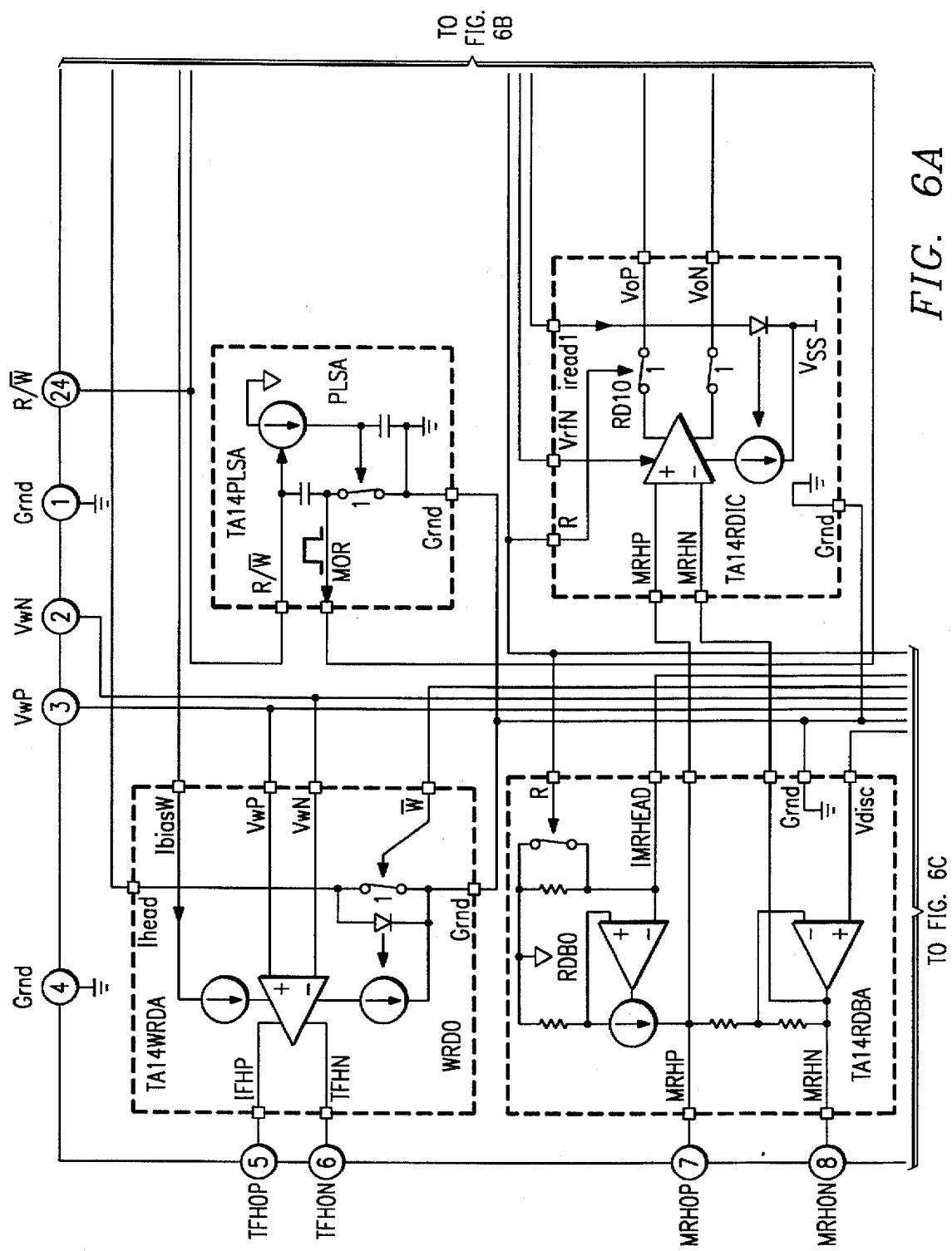
Figure 6B:
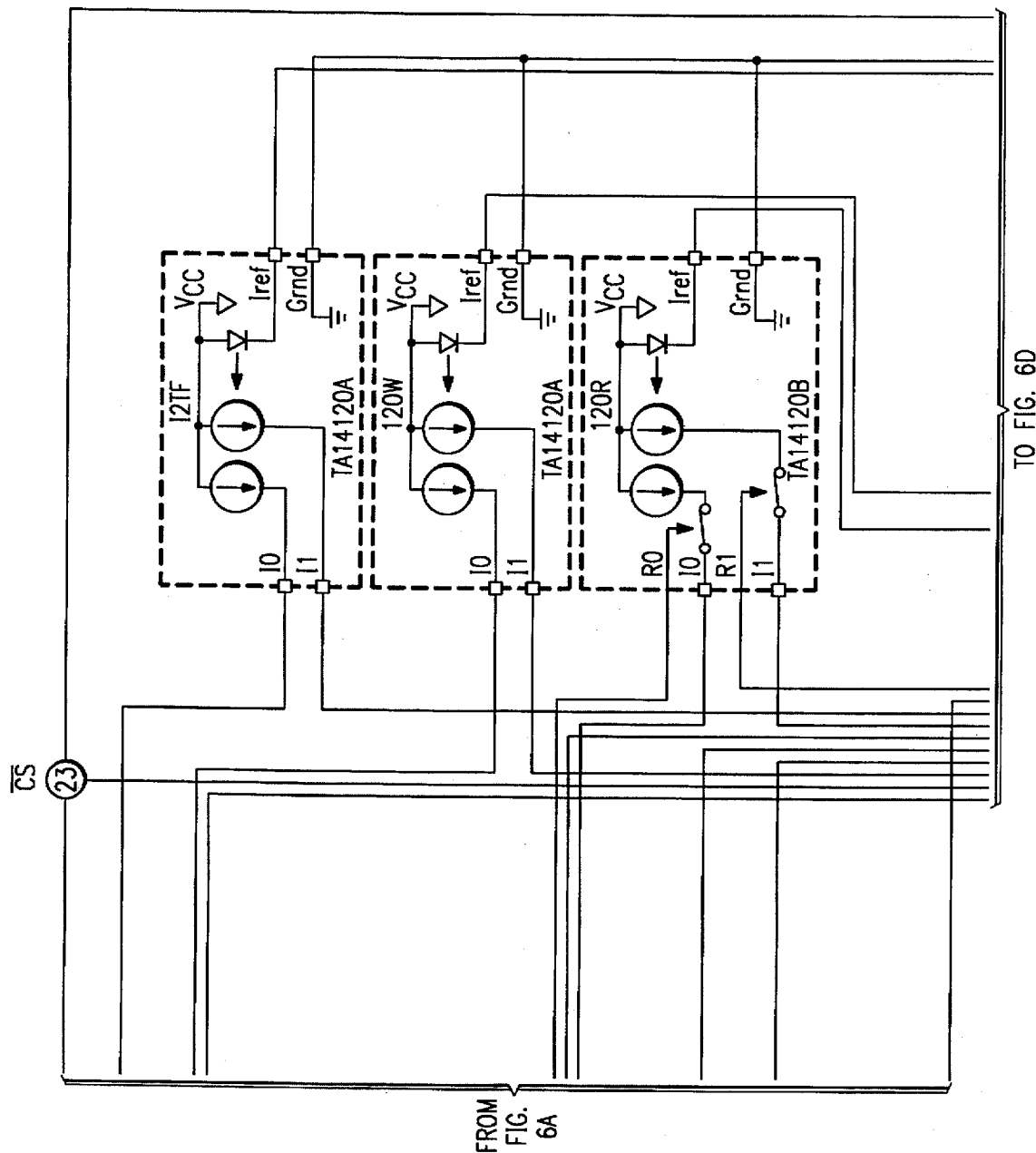
Figure 6D:
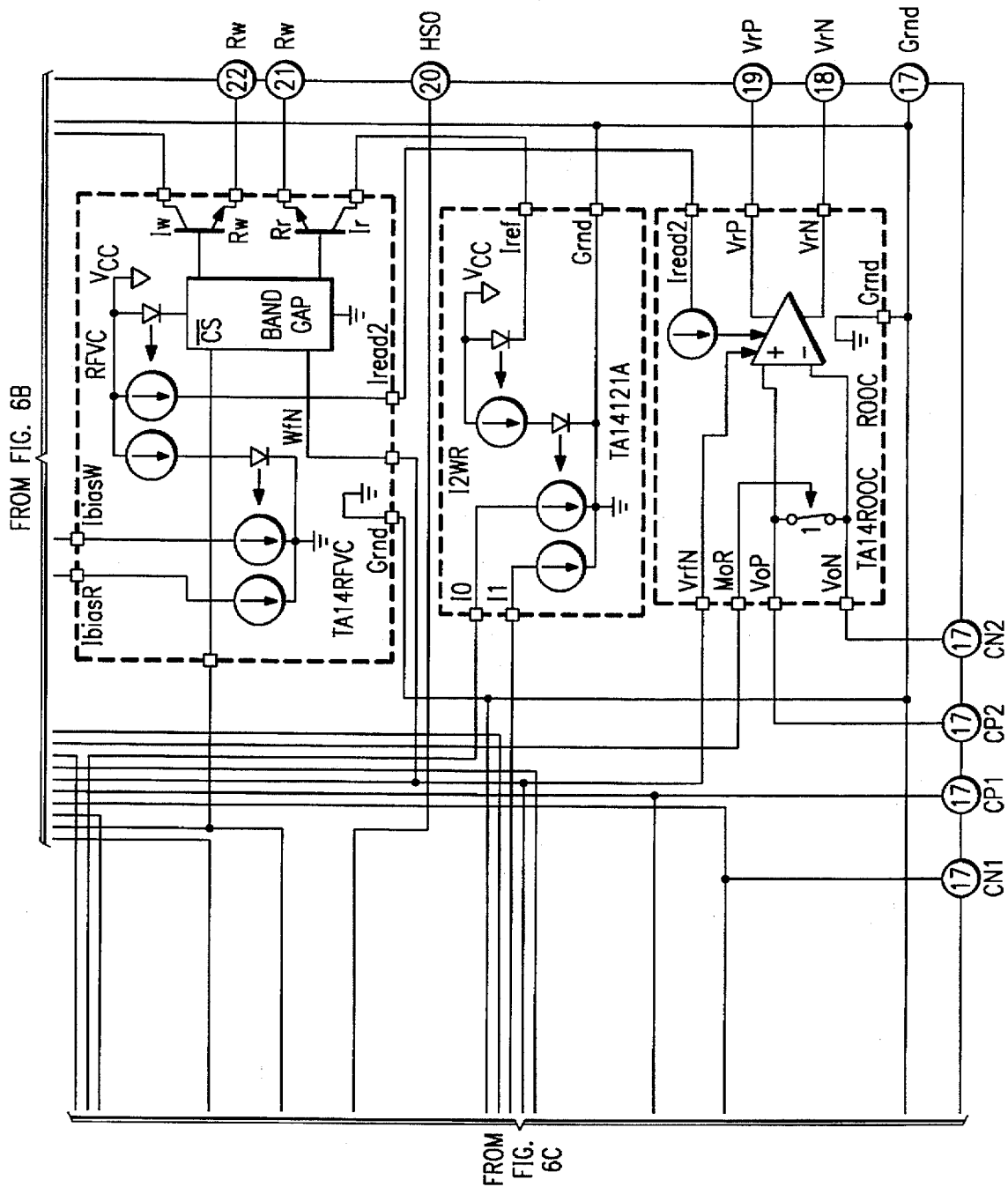

FIGS. 5A, 5B, and 5C are three parts of a single drawing which shows details of the presently preferred embodiment of the write amplifier. In this drawing the power path is delineated by tripled lines.

The innovative write amplifier described herein receives, as input, a differential signal which is ECL compatible. (These signals are "PECL," i.e. positive ECL, in the presently preferred embodiment. In systems with 5V supply, such signals typically use voltage levels of 3.95±0.25V, i.e. supply voltage minus 1.3V and supply voltage minus 0.8V. This is a digital signal representing the data to be written.

Transistors QN15/QN16 provide a differential input stage, driven by differential inputs VwP/VwN. (This is an emitter follower circuit biased with a current source, namely QN26 pulling to ground.) Level-shifting is provided by diodes QN17–20, and the differential output drives a second (and larger) differential pair QN13/QN14. The reason for this level-shifting is that there is a differential pair created by QN13 and QN14 which is going to steer a bias current (created by QN24) to pull down on the two resistors R1/R2 at the top. If the input to the QN13/QN14 differential stage swung rail to rail, the voltage drop across one of the resistors R1/R2 could become relatively large (about 2.9 volts with the 1.5K Ω resistor values of the presently preferred embodiment). Therefore, if we didn't level shift with the two diodes on the emitter follower stage, the emitters of QN13 and QN14 could rise too high, such that if all the current flowed through one resistor, it would pull down the collector voltage of one of the drivers QN13/QN14 to the point where the device saturated, which is undesirable. The level-shift also prevents QN13 and QN14 from saturating even if the common mode signal on VwP and VwN goes up to the positive supply.

The QN13/QN14 differential pair (loaded by resistors R1/R2) is connected to drive the NPN pull-up transistors QN3 and QN4, which are respectively connected to drive the write head connections TFHP/TFHN. (The circuitry shown is preferably located close to the bond pads, to reduce the inductance of the on-chip wiring. Similarly, depending on space constraints of package size and layout, wide wiring can optionally be used for routing the signals to the bond pads, and/or multiple bond pads and/or bond wires can be used for external connection to these signals, to reduce parasitic inductance.)

The voltage of the base of QN3 is translated by QN1 and scaled by the resistor ladder R3+R4+R5 to a reduced fraction of the margin above QN9 (i.e. to a reduced fraction of a voltage which is two $V_{BE}$s above ground):

$$V_{bQN5} = (V_{bQN3} - V_{BE}) \left( \frac{R5}{R3 + R4 + R5} \right) + 2V_{BE}$$

Transistor QN5 receives this voltage on its base, and drives a corresponding base current onto pull-down transistor QN8. Thus when QN3 is turned on (pulling terminal TFHP high), transistor QN8 is automatically also turned on (pulling terminal TFHN low, and thus pulling current through the write head from TFHP to TFHN).

The other pull-up transistor QN4 is connected to an identical shifting and scaling circuit: the voltage of the base of QN4 is translated by QN2 and scaled by the resistor ladder R6+R7+R8 to a reduced fraction of the margin above QN11 (i.e. to a reduced fraction of a voltage which is two $V_{BE}$s above ground). Transistor QN6 receives this voltage on its base, and drives a corresponding base current onto pull-down transistor QN7. Thus when QN4 is turned on (pulling terminal TFHN high), transistor QN7 is automatically also turned on (pulling terminal TFHP low, and thus pulling current through the write head from TFHN to TFHP).

Note that the various stages are driven by emitter current sources of two types: the output stage current is controlled by input Ihead which defines the permissible head current, and the other stages' currents are defined by a bias current input IbiasW. In a write amplifier, we also have to control the amount of current, to limit the maximum current in the head.

The MOS transistors MN2/MN3 at the bottom right disable the write amplifier (by disabling the current sources) when the write mode, as indicated by active-low signal W\, is inactive.

In the presently preferred embodiment, the inputs VwP and VwN are not only PECL signals (and accordingly referenced to the positive supply), but are also defined to have a special operation mode where the common mode voltage can go up to the positive supply voltage (+5V in this example).

The current source which feeds the is drawn as two parallel transistors QN28 and QN29 to indicate a layout feature: form the current source. Those two transistors are actually laid out as two separate devices. They are being mirrored off of the current in QN30 and QN31, which are also laid out as two separate (but much smaller) devices. Therefore, the ratio of the current flowing in QN30 +QN31 to the current flowing in QN28+QN29 would be quite precisely 1:20. The two pairs of transistors are laid out in a crossing pattern, so that the pairs have the same centroid. This is done to achieve precise matching.

QN21 plus resistors R9 and R10 forms a $V_{BE}$ multiplier. Note that base current compensation is used in the current mirror architecture, to mirror $I_{head}$ as exactly as possible, to provide exactly 20 times $I_{head}$ in the collectors of QN28 and 29.

The accuracy in the write amp is not required by the write operation itself, but in order to permit the drive manufacturer to control exactly the current at the write head. The drive manufacture will specify the write head current with an external program resistor. The drive manufacturer wants to have as much control over that value as possible. The drive manufacturer wants to be able to measure that resistor and plug its value into a formula and calculate the head current exactly. For different media head characteristics, different currents may flow in the head. Moreover, the head may be manufactured with some error, or may float fractions of a micron higher than normal, or the media may be coated so that its thickness is a little too high or low. Depending on these manufacturing variations, the drive manufacturer may wish to increase or decrease the head current. Note also that the manufacturer does not necessarily have to use an external resistor to set that current: alternatively a D/A converter plus a voltage to current converter can be used. This arrangement permits the drive manufacturer to simply use a binary word to program the current to ground; by connecting that current to pin Ihead, the manufacture can control the head current to be exactly 20 times Ihead. Thus, the drive manufacturer can vary the head current programmably on the fly, to optimize his write characteristics.

The bottom line is they want to fiddle, and not only do they want to fiddle, but they want to know what that value is and they'd like it to be as accurate as possible. The spec calls out 8% which is pretty gross, and we like to blow that away to make sure that we're better than our competition. We control to even 1%. And this current mirror is an example of that type of accuracy. MOSFET MN4 (W/L 50 µ/1.2 µ) feeds the bases of the QN30, QN31, QN28, and QN29 current mirror. This avoids any base current error in the current mirroring. Moreover, since the NMOS device has about a 1 volt threshold, the gate of that NMOS device would hover about 1 volt about the base connection which is 0.7 volts above the emitter, which means the Vce on QN30 and QN31 will be 1.7 volts and the Vce on QN28 and QN29 will typically be around 0.91 volt, which is the reason why the Vbe multiplier is used in the presently preferred embodiment. That is, the current mirror by itself would suffer an Early voltage effect, since the Vce on QN30+QN31 would be bigger than the Vce on QN28+QN29. However, the Vbe multiplier drops the Vce voltage of QN30+QN31 to make it more correctly match the Vce of QN29.

Note the connections of emitter coupled differential pair QN7/QN8, driven by the pull-up emitter followers QN3 and QN4. The combination of these provides a current limited bipolar output drive stage. The current limiting is provided by the current source, QN28/QN29. Four large transistors provide the bipolar output: QN3, QN4 are the sourcing transistors. and QN7 and QN8 are the sinking transistors. The maximum amount of current that you can get to flow across the terminals TFHP and TFHN is determined by the current source QN28/QN29. To send current out of the TFHP terminal, we want to drive the base of QN3 up to the rail. We would like TFHN to sink current then, in which case we want QN4 to be driven way down so that the emitter base junction eventually becomes reverse biased and falls out of the picture. QN8 sinks all of the current created by the current mirror QN28/QN29. That would correspond to current flowing in one direction—into TFHP and out of TFHN. If current flows in the other direction, the picture is exactly reversed and QN4 would source current to terminal TFHN, and QN7 would sink current from the terminal TFHP.

Now consider what happens during transient switching, and why all these transistors are never driven in saturation. (Clearly, QN3 and QN4 can never be in saturation because the bases can't go above the supply.) Now consider the case where QN3 is driven to the plus supply: none of the biasing current QN24 is steered through R1, so R1 has essentially no voltage drop. (Eventually R1 will see a tiny voltage drop, due to the base current drawn by QN3 times R1; but this is almost uniform because it also happens in the other rail.) When QN3 is pulled to plus supply, QN1 acts as an emitter follower, but the output of QN1 is level shifted by the resistor ladder R3+R4+R5. These resistors (and the two diodes QN9/QN10) provide level shifting in a proportional way. The function of these elements is not merely shifting, but shifting and scaling. QN9 and QN10 make two diodes, so the collector of QN9 is at 1.4 volts ($2V_{be}$). The 1:3 scaling provided by the resistor ladder means that the base of QN5 will be ⅓ the voltage difference between the emitter of QN1 and the collector of QN9, so that as the emitter voltage of QN1 goes up and down, we get not only a level shifting on there, but also a voltage division effect.

The result of this shifting and scaling is that when QN3 has its base pulled to plus supply, the base of QN5 will be pulled to a higher voltage than the base of QN6 (which is connected just like QN5, except that QN6 is driven by the emitter follower stage on QN2).

When R1 was shut off, the voltage drop across R2 goes down 2.9 volts, because all the bias current of QN24 is steered through R2. Therefore, the emitter follower QN2 has its base going down 2.9 volts, which means that the voltage on QN6 is going to be lower than the voltage on QN5. In the presently preferred embodiment, QN5 and QN6 are straight emitter followers, biased from QN22 and QN23.

Basically, the pullup side of the bridge is pretty normal. We've got a differential amplifier, we're coming in and driving that in a way that's dictated by this particular application, but the way that we drive the pulldown side of the H-bridge, that's where we have the problem of making sure that we don't saturate. How do we do that? We are mirroring current out of each of our pullup transistors, we are shifting and scaling that current and using it to drive the gate of the respective pulldown with respective opposite pulldown transistors. And that, plus the limited current source on each half-bridge given us this relation where the preliminary driving stages let us avoid saturation on the pullups and this linkage avoids saturation of the pulldown.

As discussed above, when we initially try to switch the current on the inductor, that inductor is going to look like an infinite resistance instantaneously. Thus we have to provide a current path inside the amplifier stage such that, although no current flows through the inductor, the programmed current will flow through the inside of the stage. Consider the case where programmed current is flowing steadily state from TFHP to TFHN, and then the base of QN3 is pulled up and the base of QN4 is pulled down. The base of QN4 would be pulled down 2.9 volts and the base of QN3 will be almost at the plus supply, minus an IR drop across the 1.5K due to the base current of QN3. The programmed current will typically be 10 to 20 milliamps at the output stage, so dividing that by a typical beta of 100 shows a typical 100 to 200 microamps of base current. This base current flowing through the 1.5KΩ resistors will give you an IR drop of about 150–300 mV voltage. However, the TFHP terminal is necessarily 0.7 volts down from the base of QN3 plus a little IR drop.

Since a typical head has a 10 ohm on resistance, a typical 10 milliamps of programmed current results in about 0.1 volt drop across the terminals TFHP and TFHN. That's 0.1 volt in the steady state, not the transient. If TFHP is hanging about 0.8 volts below plus supply (due to the QN3 plus the IR drop across R1), then TFHN is hanging about 0.9 volts from the plus supply. Since the bases of QN4 and QN2 have been switched by R2 to 2.9 volts below plus supply, the base-emitter junction of QN4 is reverse biased and out of the picture. In addition, the Vce on QN4 is big enough to keep QN4 out of saturation.

Now consider the level shifting done by QN1 and QN2, the emitter followers that feed the resistive dividers, which are tapped into another pair of emitter followers created by QN5 and QN6 to drive the lower transistors. When the base of QN3 is at plus supply, this also causes the base of QN1 to go to plus supply, which causes the base of QN5 to be higher than the base of QN3, which causes the base of QN8 to be higher than the base of QN7, and therefore, all of the programming current is steered through QN8 and is being pulled out of the TFHN node. That is the steady state for current flowing out of the TFHP into the TFHN.

When we switch the inputs instantaneously, we are trying to reverse that whole picture, but the coil is initially going to act like an infinite resistance. As soon as we apply a voltage across the coil, we get a dI/dt that corresponds to the driven voltage, and the current is going to ramp in the opposite direction until it reaches the programmed value. When it reaches the programmed value, it is going to slide into the steady state and the voltage across the head is going to be reduced to the IR drop again. So that transient is designed to pump as big a voltage as possible across the inductor, to ramp the current in the opposite direction as quickly as possible, and then let the programmed current come in and limit the voltage drop across the inductor.

The stage is designed to switch as big a voltage as possible across the coil, to maximize dI/dt. (The bigger the V the bigger the dI/dt.) The large applied voltage will remain until the current on the inductor ramps up in the opposite direction to equal the programmed value. When it equals the programmed value, the circuit is going to shift and allow the IR drop across the coils to be the steady state value. Now consider the transition between those two points: note first that all the transistors remain in the active region, and we provide a path for the programmed value of current to flow through the internal part of the circuit while it is ramping up in the coil.

Suppose that QN3, after being at plus supply, is switched, and the base of QN3 goes down. Instantaneously, the connection between TFHP and TFHN looks like an infinite resistance, and with QN3 going down, QN7 is going to want to conduct all of the current.

The base of QN4 is going to go to the plus supply rail and start sourcing current. However, TFHN will not source all of the programmed current, because instantaneously the inductance will act like a large resistance. The inductance can be thought of as a current source, during the delay until the current decays and then drives in the opposite direction. Thus when QN3 is driven down it will not pass current, but neither will any current flow into QN7. Instead, current will flow out of QN4, because QN4 is now being switched to the plus supply and the coil is looking like an infinite resistance. Thus the current goes through QN8, and actually flows straight down that vertical path.

Thus under this transient condition the circuit—unlike any bridge circuit—carries crowbar current. This routing of crowbar current during the time of the inductor's ramp up keeps the switching speed high. When QN4 goes high, it wants to source current out of the inductor into the node TFHP; and QN2 necessarily also goes high, and wants to turn on QN7. QN7 will want to sink current into TFHP.

QN2 drives the resistor ladder, and drives QN6 to turn on QN7. Note that there is an alternate path. Again, suppose we are initially in the steady state where TFHP was sourcing current, and then we switch (i.e. the base of QN4 goes to plus supply and QN4 tries to source current). QN3 is switched low and the base of QN3 is going to see a 2.9 volt drop. The coil is going to act like an infinite resistance, but QN7 wants to sink the current. The reason QN7 wants to sink the current is because the base of QN6 was switched by QN2 to plus supply, so that we are sourcing current out of TFHN via QN4 and sinking current with QN7. But the instantaneously infinite resistance of the coil will cause the emitter of QN3 to act as the load for QN7. Now the connection TFHP will be pulled down 0.7 volts, and QN3 will end up sourcing all the current for QN7 and eating up all of the program current. None of the current will flow through QN4—instead we will end up with a diode drop across QN4—so the TFHN terminal will go to about 0.8 volts below plus supply. The TFHP terminal will go 2.9+a Vbe below the TFHN terminal. The IR drop across R1 ends up being the instantaneous voltage being switched across the coil. Now current flows through QN3 into QN7, and we have this 2.9 applied voltage across the coil.

Now the current begins to ramp up in the coil, and as the current ramps up in the coil the current flowing through QN3 begins to go down, but as long as there is current flowing in QN3 there will be a Vbe drop, and TFHP will be 2.9 volts below TFHN. As the current ramps up in the coil, all of the programmed current begins to be absorbed by QN7. All of a sudden, the Vbe on QN3 goes away, because all of the current is now flowing through the coil and the coil voltage begins to rise, reverse biasing the junction on QN3. So what you see is instantaneously, TFHP goes 2.9 volts below TFHN and all of the current flows through QN3 and QN7 to the programming current source, and then as the current ramps up into the coil, according to the dI/dt created by the 2.9 volts, the current in the coil eventually equals the programming current value. The 2.9 volts across R1 minus the Vbe of QN3 is still well above the emitter voltage of QN7, and keeps QN7 in the active range, which is an advantageous result of the level shifting of QN6 and the resistor voltage-dividing ladder. That guarantees that the base of QN7 is sufficiently below the emitter of QN2, so that QN7 will not saturate.

FIGS. 6A to 6D are four parts of a single drawing which shows a sample drive head interface which advantageously incorporates two write amplifiers WRD0 and WRD1 according to FIG. 5. This interface includes connections (TFH1N/P and TFH0N/P) for two thin-film write heads, and also includes connections (MRH0N/P and MRH1N/P) for two magnetoresistive read heads. Biasing for the magnetoresistive read heads is provided by circuit blocks RDB0 and RDB1. Read amplification is provided by circuit blocks RD10 and RD11. The operation of these blocks is described in greater detail in the following applications, all of which have effective filing dates identical to that of the present application, and all of which are hereby incorporated by reference:

U.S. Ser. No. 08/366,561, filed Dec. 30, 1994, entitled "AC Input Stage with Reduced Transient Time for Use in Multiplexing Transducers that Require a Switched DC Bias" (Atty's docket 94-S-115/SGS-078);

U.S. Ser. No. 08/366,792, filed Dec. 30, 1994, entitled "Symmetrical Resistive Transducer Biasing Circuit and Methods" (Atty's docket 94-S-118/SGS-079); and U.S. Ser. No. 08/366,790, filed Dec. 30, 1994, entitled "Differential Amplifier with Proxy Load for Control of Output Common Mode Range" (Atty's docket 94-S-119/SGS-080).

Note that the innovative circuit provides a transmission line driver, which can be used for other transmission line driver applications.

For maximum speed, it is important (at least in silicon) to use NPN transistors rather than PNP. PNP transistors are slower than NPN transistors, and their parasitics are much bigger. This is not just a question of time, but also a question of carrier lifetime and charge storage. PNPs also have a lower beta.

Bipolars also have a significant advantage over FETs: the magnitude of an NPN transistor's Vbe is 0.7 volts, whereas the threshold on a FET is typically greater than 1 volt. This provides increased headroom.

One of the key features of this circuit is taking the signal that is switching, for example QN3 to the plus supply and using it to drive the opposite transistor QN8 high enough to turn on and sink the current, and that level shifting circuit is so immediate, so close to the stage, that we almost wiped out the need to conceive of this thing as an H-bridge. It's really just a differential driver, and the signal that is coming into QN3 driving QN3 high is also switching QN8. The signal that's switching QN4 is driving QN7, and that kind of diagonally opposed cross coupling is the key to the whole circuit, and the fact that it's 100% NPN designed. 100% NPN designed translates into the highest possible speed of operation.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

Figure 1A:
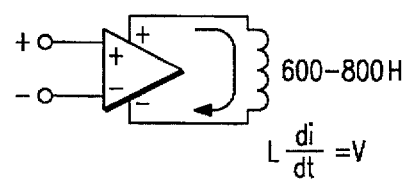
FIG. 1A shows a simplified circuit diagram of the connection of a write amplifier to a thin film disk head.
Figure 1B:
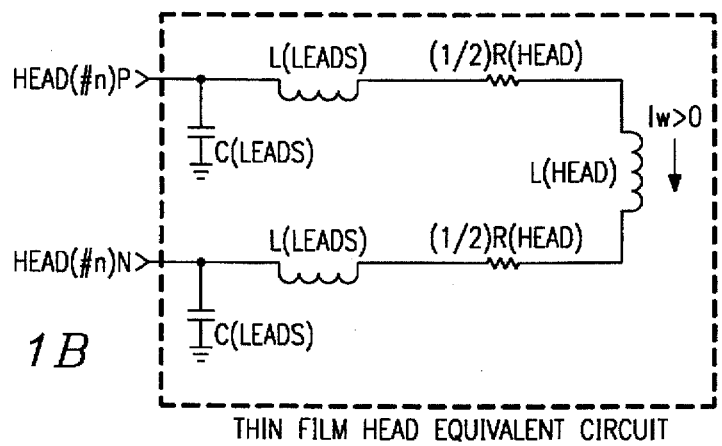
FIG. 1B shows a more detailed model of the thin film disk head, including its connections.
Figure 2:
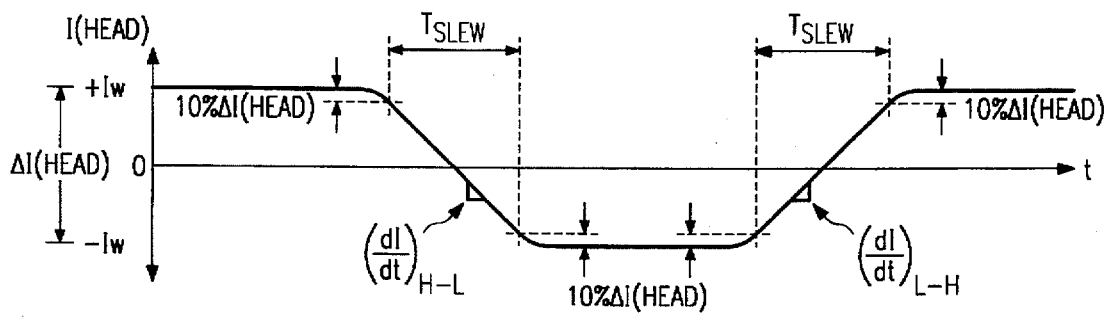
FIG. 2 is a current timing diagram, showing how the head current behaves during two transitions in opposite directions.
Figure 3:
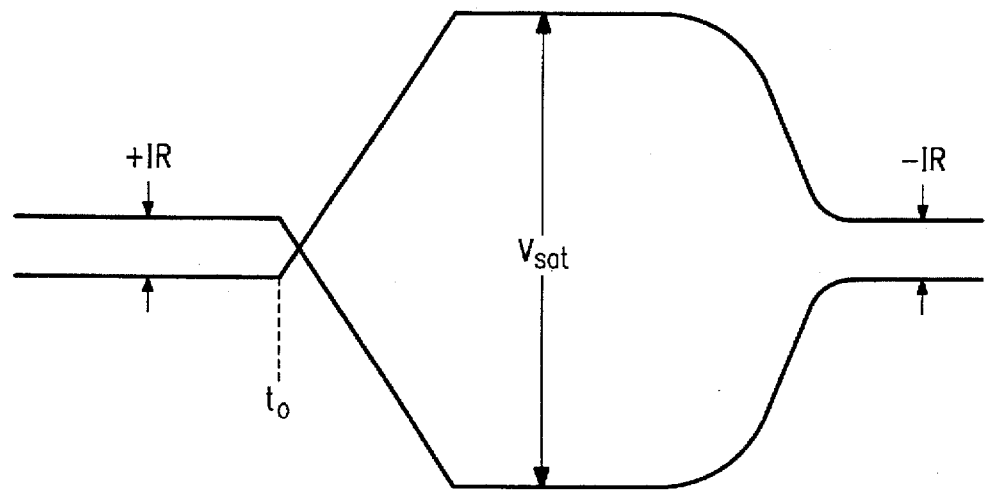
FIG. 3 is a voltage timing diagram, showing how the voltage across the head is changed during a single transition as performed by the circuit of the present invention.

For another example, the sample circuit of FIG. 1 can easily be modified to include other level-shifting and buffering stages.

For another example, the sample circuit of FIG. 1 can easily be modified to even operate from a single-ended data input signal if desired.

For another example, more stages or fewer stages of amplification can be used.

For another example, the nonsaturating driver circuit can be used without the precision circuitry for external write current selection.

For another example, if heterojunction bipolar processes reach production, the claimed circuit can be readily adapted to use heterojunction bipolar transistors.

In a further alternative and less preferred class of embodiments, the disclosed circuit can also be adapted to use with PNP drivers. Obviously NPN is preferable, but the circuit innovations will at least provide better performance from a PNP process than might otherwise be available. This may be useful, for example, in certain BiCMOS processes which do not provide a good NPN transistor.

In one alternative class of embodiments, the differential drive is applied directly to the low side (rather than to the high side), and is shifted and scaled to provide differential drive currents for the high side (rather than the low side).

In some alternative and less preferred embodiments, it may alternatively be possible to merely translate one set of base drives to generate the other set of base drives. However, this is much less preferred, since it risks sacrificing the balance of on-state admittances achieved by the primary preferred embodiment.

Another possible application of the disclosed innovative circuit would be a voice coil driver. Other applications would be in other fast positioning applications where you've got an inductive load and you really want to be able to make a rapid transition.

Another application is for ultrasonic drivers for operation at very high frequencies. This can be advantageous for medical imaging.

With loads of smaller inductance values, the disclosed circuit has the potential to operate at hundreds of megahertz with conventional technology.

The disclosed innovations also provide future capability for magnetic head technology: as heads and media undergo further development, the disclosed innovative circuit can readily be adapted to higher write speeds.

A further application is for extremely simple VHF and UHF transmitters, although of course the off-chip coupling will have to be implemented with technology which reduces parasitic inductance.

Another possible application is phased-array radar systems, to get the bandwidth needed to rapidly steer the beam.

What is claimed is:

1. A differential output driver circuit comprising:

circuitry for buffering an input signal, and for providing a corresponding buffered differential signal;

a first pair of differentially connected transistors, operatively connected to be driven by said buffered differential signal, and operatively connected to drive first and second respective differential output terminals in a first direction;

shifting circuitry connected to shift and scale down the base voltages of said first pair of transistors, to provide differential current outputs corresponding to shifted and scaled copies of the base currents of said first pair of transistors; and a second pair of differentially connected transistors, operatively connected to be driven by said differential current outputs of said shifting circuitry, and operatively connected to drive said differential output terminals in a second direction which is opposite to said first direction;

wherein said shifting circuitry is proportioned to produce said differential current outputs at a voltage which cannot drive said second pair of transistors into saturation.

2. The driver circuit of claim 1 wherein said shifting circuitry comprises both voltage scaling circuitry. which scales down the differential base voltages of said first pair of transistors, and an emitter follower transistor which provides said current output correspondingly.

3. The integrated circuit of claim 1 wherein said shifting circuitry includes a tapped ladder of load elements.

4. The driver circuit of claim 1 wherein said input signal is differential.

5. The driver circuit of claim 1 wherein said input signal is a positive ECL signal.

6. The driver circuit of claim 1 wherein said input signal is referenced to a positive supply voltage, and can have common mode range up to said positive supply voltage.

7. A differential output driver circuit, comprising:

a control terminal for receiving a programmed current input;

circuitry for buffering an input signal, and for providing a corresponding buffered differential signal;

a first pair of differentially connected transistors, operatively connected to be driven by said buffered differential signal, and operatively connected to drive a first and second respective differential output terminals in a first direction;

shifting circuitry connected to shift and scale down the base voltages of said first pair of transistors, to provide differential current outputs corresponding to shifted and scaled copies of the base currents of said first pair of transistors; and a second pair of differentially connected transistors, operatively connected to be driven by said differential current outputs of said shifting circuitry, and operatively connected to drive said differential output terminals in a second direction which is opposite to said first direction;

wherein said first and second pairs of transistors are jointly connected to pass a total current which is strictly proportional to said programmed current input and said shifting circuitry is proportioned to produce said differential current outputs at a voltage which cannot drive said second pair of transistors into saturation.

8. The driver circuit of claim 7 wherein said shifting circuitry comprises both voltage scaling circuitry, which scales down the differential base voltages of said first pair of transistors, and an emitter follower transistor which provides said current output correspondingly.

9. The driver circuit of claim 7 wherein said shifting circuitry includes a tapped ladder of load elements.

10. The driver circuit of claim 7 wherein said input signal is differential.

11. The driver circuit of claim 7 wherein said input signal is a positive ECL signal.

12. The driver circuit of claim 7 wherein said input signal is referenced to a positive supply voltage, and can have common mode range up to said positive supply voltage.

13. A computer disk drive, comprising:

a computer readable magnetic media rotatably mounted on a drive shaft;

an inductive head positioned in proximity with said magnetic media to read and write data on said magnetic media in response to driver signals; and a driver circuit to generate said driver signals to control operation of said inductive head, said driver circuit comprising:

a buffer circuit to buffer an input signal and generate a corresponding buffered differential signal;

a first pair of differentially connected transistors, operatively connected to be driven by said buffered differential signal, and operatively connected to drive a respective pair of output terminals in a first direction, said output terminals being coupled to said inductive head;

shifting circuitry connected to shift and scale down the base voltages of said first pair of transistors, to provide differential current outputs corresponding to shifted and scaled copies of the base currents of said first pair of transistors; and a second pair of differentially connected transistors, operatively connected to be driven by said differential current outputs of said shifting circuitry, and operatively connected to drive said pair of output terminals in a second direction which is opposite to said first direction;

wherein said shifting circuitry is proportioned to produce said differential current outputs at a voltage which cannot drive said second pair of transistors into saturation.

14. The disk drive of claim 13 wherein said driver circuit is implemented on a substrate as an integrated circuit.

15. The disk drive of claim 13 wherein said first and second pairs of differentially connected transistors are NPN transistors.

16. The disk drive of claim 13 wherein said shifting circuitry comprises both voltage scaling circuitry which scales down the differential base voltages of said first pair of transistors, and an emitter follower transistor which provides said current output correspondingly.

17. The disk drive of claim 13 wherein said shifting circuitry includes a tapped ladder of load elements.

18. The disk drive of claim 13 wherein said input signal is differential.

19. The disk drive of claim 13, further including a program input terminal to said drive circuitry to receive a program current signal wherein said first and second pairs of transistors are jointly connected to pass a total current which is proportional to said programmed current signal.

20. A method of controlling a computer disk drive, comprising the steps of:

rotating a computer readable magnetic media rotatably mounted on a drive shaft;

positioning an inductive head in proximity with said magnetic media to read and write data on said magnetic media in response to driver signals; and generating said driver signals in a driver circuit to control operation of said inductive head, said driver circuit operation comprising the steps of:

buffering an input signal and generating a corresponding buffered differential signal;

driving a first pair of differentially connected transistors with said buffered differential signal, said first pair of transistors operatively connected to drive a respective pair of output terminals in a first direction, said output terminals being coupled to said inductive head;

shifting and scaling down the base voltages of said first pair of transistors, to provide differential current outputs corresponding to shifted and scaled copies of the base currents of said first pair of transistors; and driving a second pair of differentially connected transistors with said differential current outputs of said shifting circuitry, said second pair of transistors being operatively connected to drive said pair of output terminals in a second direction which is opposite to said first direction;

wherein said shifting circuitry is proportioned to produce said differential current outputs at a voltage which cannot drive said second pair of transistors into saturation.

21. The method of claim 20 wherein said first and second pairs of differentially connected transistors are NPN transistors.

22. The method of claim 20, further including the step of receiving a program current signal at a program input terminal to said drive circuitry wherein said first and second pairs of transistors are jointly connected to pass a total current which is proportional to said programmed current signal.

* * * * *